United States Patent [19]

Ng et al.

[11] Patent Number: 5,583,359

[45] Date of Patent: Dec. 10, 1996

[54] CAPACITOR STRUCTURE FOR AN INTEGRATED CIRCUIT

[75] Inventors: Anthony C. C. Ng, Ottawa; Mukul Saran, Kanata, both of Canada

[73] Assignee: Northern Telecom Limited, Montreal, Canada

[21] Appl. No.: 398,264

[22] Filed: Mar. 3, 1995

[51] Int. Cl.$^6$ .................................................. H01L 27/108
[52] U.S. Cl. .......................... 257/306; 257/307; 257/308; 257/532; 257/534
[58] Field of Search ..................................... 257/303, 306, 257/307, 308, 309, 532, 534, 535; 361/303, 306.1

[56] References Cited

U.S. PATENT DOCUMENTS

| | | | |
|---|---|---|---|
| 5,142,639 | 8/1992 | Kobyama et al. | 357/23.6 |
| 5,189,594 | 2/1993 | Hoshiba | 257/295 |
| 5,208,725 | 5/1993 | Akcasu | 257/307 |
| 5,275,974 | 1/1994 | Ellul et al. | 437/203 |

FOREIGN PATENT DOCUMENTS

| | | | |
|---|---|---|---|
| 59-055049 | 3/1984 | Japan. | |
| 61-259560 | 11/1986 | Japan | H01L 27/01 |
| 62-104067 | 5/1987 | Japan | H01L 27/04 |
| 1-120858 | 5/1989 | Japan | 257/307 |
| 3-099461 | 4/1991 | Japan | H01L 27/04 |
| 3-241864 | 10/1991 | Japan | H01L 27/04 |
| 3-257855 | 11/1991 | Japan | 257/532 |

*Primary Examiner*—Minhloan Tran
*Attorney, Agent, or Firm*—Angela C. de Wilton

[57] ABSTRACT

A capacitor structure for an integrated circuit and a method of fabrication are described. The capacitor structure is defined by layers forming interconnect metallization and interlayer dielectrics. The latter are relatively thick, and provide high breakdown voltages. Multilevel metallization schemes allow for a stack of a plurality of electrodes to be provided. The electrodes may take the form of stacks of flat plates interconnected in parallel so that the capacitance is the sum of capacitances of alternate layers in the stack. Advantageously each electrode comprises a main portion and a surrounding portion having the form of a protecting ring, coplanar with the main portion of the electrode. The ring prevents thinning of the dielectric near edges of electrode during fabrication, to improve control of breakdown voltages for high voltage applications. Alternative electrode structures employing a plurality of interconnected fingers, and particularly a configuration having interdigitated fingers, are provided to increase the capacitance per unit surface area. Parallel electrode fingers are stacked in vertical alignment, or offset, and interconnected to provide vertical, horizontal or inclined stacks having different patterns of polarities, thereby forming capacitors of various configurations. The capacitor structures have particular application for high voltage (>100 V), low leakage and high frequency (MHz/GHz) applications.

19 Claims, 10 Drawing Sheets

CAPACITOR STRUCTURE FOR AN INTEGRATED CIRCUIT

FIELD OF THE INVENTION

This invention relates to a capacitor structure for an integrated circuit and a method of fabrication thereof, with particular application to capacitors for high voltage, high frequency and low leakage applications.

BACKGROUND OF THE INVENTION

Conventionally, capacitor structures for integrated circuits comprise either a flat plate capacitor structure or a trench capacitor structure. Flat plate capacitors typically comprise first and second layers of conductive material patterned to define top and bottom electrodes, with an intervening layer of a thin capacitor dielectric, the structure being isolated from the substrate by an underlying dielectric layer, e.g. by formation of the capacitor structure on top of a thick field isolation oxide layer. The bottom electrode typically comprises a layer of conductive material, e.g. polysilicon, which forms other structures of the integrated circuit, e.g. gate electrodes or emitter structures of transistors. The second (top) electrode is defined thereon by a second conductive layer, typically another polysilicon layer. The capacitor dielectric is conventionally a thin silicon dioxide or silicon nitride layer. Recently other dielectric materials including tantalum oxide and ferroelectric dielectrics are being used for capacitor dielectrics. However, the latter usually require special electrode materials and barrier layers to prevent reactions between the ferroelectric dielectric and electrode materials.

Trench capacitors are conventionally formed by conductive and dielectric layers provided within trench regions defined in the substrate, e.g. by patterning concentrically arranged vertical electrodes. Another approach to a trench capacitor structure is described in U.S. Pat. No. 5,275,974 to Ellul et al. and is based on a method of deposition of conformal layers of conductive and dielectric materials within trench regions, which are then planarized by chemical mechanical polishing to provide for coplanar contacts to each electrode.

Various other schemes are known for increasing the capacitance per unit area, for example a stacked metal-insulator-metal capacitor for a DRAM, as described in U.S. Pat. No. 5,142,639 to Koyhama. U.S. Pat. No. 5,189,594 to Hoshiba describes a capacitor having comb like electrodes which intersect to provide a plurality of small value capacitors connected in parallel. Examples of multilayer metal-insulator-metal capacitors are described in Japanese patent applications J6210467 to Katsumata and J59055049 to Suzuki.

However, in either flat plate or trench capacitors, the capacitor dielectric thickness is a major factor in determining the capacitance per unit area. Thin dielectrics are required to increase the capacitance per unit area, i.e. to allow for smaller area capacitors, as required for high density integrated circuits. The drawback is that thinner dielectrics result in lower breakdown voltages. Typical known capacitor structures with thin dielectrics used for 3.3 V and 5 V integrated circuits, for example, have breakdown voltages of ~16 V. For operation of integrated circuits at a higher voltage, e.g. 12 V typically used for some telecommunications applications, a breakdown voltage of 16 V would be insufficient.

Thus, for the latter high voltage applications, different capacitor structures are required to obtain reduced area devices with high capacitance and higher breakdown voltages (~100 V). Further, high frequency response, in the GHz range, is also an important consideration for applications of advanced bipolar-CMOS integrated circuits, e.g. for telecommunications applications.

SUMMARY OF THE INVENTION

The present invention seeks to provide a capacitor structure for an integrated circuit and a method of fabrication thereof, which reduce or avoids the above-mentioned problems, and with particular application for high voltage, high frequency and low leakage capacitors.

Thus according to one aspect of the present invention there is provided a capacitor structure for an integrated circuit having multilevel interconnect metallization comprising a plurality of layers of conductive metallization and layers of interlayer dielectric, the capacitor structure comprising:

an isolation layer having formed thereon a first electrode defined by part of a first layer of conductive metallization;

a layer of capacitor dielectric formed thereon provided by part of a first interlayer dielectric;

a second electrode defined by part of a second layer of conductive metallization;

each electrode comprising a main portion having a boundary and defining at least one edge, and a surrounding portion, the surrounding portion being spaced from the main portion along said at least one edge.

Thus, capacitor electrodes are defined by parts of conductive layers forming the interconnect metallization of the integrated circuit. The capacitor dielectric is provided by a layer of interlayer dielectric which typically separates layers of interconnect metallization. Each capacitor electrode comprises a main portion, which may be in the form of a conventional plate, and a surrounding portion, spaced from the main portion, which for example, takes the form of a ring provided by the part of the same conductive layer that forms the main portion of the capacitor plate. A ring which surrounds the main portion, may be separated from the main portion or may be in contact with the main portion along part of the boundary of the main portion. The surrounding portion functions to ensure minimal thinning of the capacitor dielectric near edges of the main portion of the capacitor electrodes during planarization of the dielectric layers. For example, thinning may occur when using spin-on-glass followed by etch back to planarize the interlayer dielectric. Avoidance of edge thinning of the capacitor dielectric helps to control breakdown voltage, and other electrical characteristics including leakage, dielectric breakdown, TDDB, and capacitance variations. The structure may be readily fabricated using known CMOS, bipolar and BiCMOS process technologies.

Where the integrated circuit comprises multilevel metallization, a stacked capacitor structure having a plurality of electrodes may be provided. If required an underlying conductive layer, e.g. a gate polysilicon layer may provide a bottom electrode of a multilayer stack and two of more levels of interconnect metallization provides other electrodes of the stack. Interconnections are provided between alternate electrodes in a stacked capacitor structure, e.g. by vias which provide parallel connection of alternate electrodes in the stack.

For example, capacitor electrodes with their surrounding rings, may be provided in a configuration comprising conventional stacked flat rectangular electrode plates, in which the capacitance is determined by the area of overlap of the main portion of the electrodes. The capacitance of the structure is thus the sum of the capacitances of the pairs of electrodes of opposite polarities in the stacked structure.

Advantageously, the capacitor dielectric provided between two adjacent plates is a relatively thick layer of interlayer dielectric. Thus, a capacitor of this structure has a very high breakdown voltage, typically above 200 V for a conventional 1.4 µm thick interlayer dielectric. The leakage current is low, (e.g. <30 pA at 100 V).

Furthermore, since highly conductive materials used for interconnect metallization are used to build the capacitor electrodes, the frequency response of the structure is excellent. For example a 9 pF capacitor was fabricated with a series resistance of less than $0.7\Omega$ at 6 GHz, and a frequency coefficient was less than 15 ppm/MHz.

According to another aspect of the present invention, there is provided a capacitor structure for an integrated circuit having multilevel interconnect metallization comprising plurality of layers of conductive metallization separated by layers of interlayer dielectric, the capacitor structure comprising:

a stack of electrodes, each electrode defined by part of one layer of conductive metallization and comprising a plurality of interconnected conductive fingers;

the electrodes being separated by a capacitor dielectric defined by part of a layer of interlayer dielectric;

alternate electrodes being interconnected by conductive vias to provide sets of capacitor electrodes of the same polarity;

first and second electrical contacts being provided respectively to electrodes of opposite polarity, whereby the total capacitance of the stacked electrode structure is the sum of capacitances between alternate electrodes of opposite polarities Beneficially, a main portion of each electrode may comprise a plurality of interconnected conductive fingers e.g. connected at an end of each finger to form a comb-like, or grid like, electrode structure. The fingers of each electrode may be aligned vertically relative to the fingers of the adjacent electrodes. Alternatively, the fingers of one electrode may be offset so that the fingers in different layers are shifted relative to underlying and overlying fingers. The pattern of polarity of the stacked fingers is arranged to form stacks of fingers which are effectively parallel in a vertical direction and/or horizontal direction. Alternatively, the fingers are staggered to provide stacks of fingers of the same polarity which inclined with respect to the semiconductor substrate surface. The resulting arrangement of stacked fingers is in effect similar to a capacitor structure having a set of vertical capacitor plates extending into the substrate, and results in an increased capacitance per unit surface area compared with a simple flat plate arrangement.

In one arrangement, each conductive layer of metallization is patterned to form two interdigitated electrodes. Connections between electrodes are provided by appropriate arrangements of conductive vias connecting adjacent or alternate electrodes, to provide the required pattern of polarities. In a particularly convenient configuration, each electrode finger is of opposite polarity to adjacent fingers. This arrangement was found to provide a significant increase, about 40%, in capacitance per unit area over a conventional parallel planar plate configuration having the same design area.

A capacitor may be provided having a digitate electrode structure combined with protecting rings; that is, each electrode comprises a the main portion defining a plurality of conductive fingers and a surrounding portion. The latter may provide a protecting ring as described above to reduce edge thinning of the dielectric. A protecting ring may not be required for electrode structures formed using planarization by chemical mechanical planarization or other method where edge thinning can be reduced or avoided. Protecting rings are beneficial particularly to assist in planarization by a method, such as spin on glass and etchback, to avoid the cumulative effects of edge thinning when sequentially planarizing structures having several layers of interlayer dielectrics.

Advantageously, to provide a multilayer stacked capacitor structure, a bottom electrode of the capacitor may be provided by an underlying conductive layer of polysilicon, e.g. a gate metallization layer. The bottom electrode is patterned similarly to the overlying electrodes described above, and may comprise a surrounding portion and/or a plurality of conductive fingers. A plurality of overlying electrodes of the capacitor structure are then provided by some, or all, layers of a multilevel interconnect metallization scheme.

Beneficially, these structure can be adapted to various interconnect schemes without significant process constraints. That is, these structures may be fabricated using known process technologies, and using all interconnect materials currently used, for example, aluminum alloys, tungsten, doped and/silicided polysilicon. The structures are also compatible with advanced metallization schemes proposed for next generation technologies, using alternative conductive materials for example, copper and copper alloys, TiN, WN, TiWN and metal silicides.

According to another aspect of the present invention, there is provided a method of forming a capacitor structure for an integrated circuit comprising a plurality of layers of interconnect metallization separated by layers of interlayer dielectric, the method comprising:

providing a layer of interconnect metallization and defining an electrode therein comprising patterning the layer of metallization to define a main portion having a boundary and at least one edge, and a surrounding portion extending around the main portion and laterally spaced from said at least one edge;

providing thereon a layer of interlayer dielectric to form a capacitor dielectric and planarizing said dielectric layer, whereby the surrounding portion prevents thinning of edges of the capacitor dielectric during planarizing;

and, then forming thereon a second capacitor electrode.

Thus, edge thinning of the capacitor dielectric around boundaries of the main portion of each electrode may be avoided or reduced, to improve breakdown characteristics of the capacitor.

A bottom electrode of the capacitor may be defined in an underlying layer of polysilicon before the step of providing said layers of interconnect metallization.

Another aspect of the present invention provides method of forming a capacitor structure for an integrated circuit comprising a plurality of layers of interconnect metallization separated by layers of intermetal dielectric, the method comprising:

providing a layer of interconnect metallization and defining a capacitor electrode therein comprising patterning a plurality of interconnected conductive fingers;

depositing thereon a layer of interlayer dielectric to form a capacitor dielectric, and planarizing the dielectric layer;

forming thereon a second layer of interconnect metallization and defining a second capacitor electrode comprising patterning a plurality of interconnected conductive fingers, the conductive fingers of the second electrode being aligned relative to conductive fingers of the underlying electrode.

Thus aspects of the present invention provide for capacitor structures, and methods of fabrication of the capacitor structures, which overcome or avoid some of the above-mentioned problems.

BRIEF DESCRIPTION OF THE DRAWINGS

EMBODIMENTS of the invention will now be described by way of example, with reference to the accompanying drawings, in which.

DESCRIPTION OF THE PREFERRED EMBODIMENTS

Figure 1:
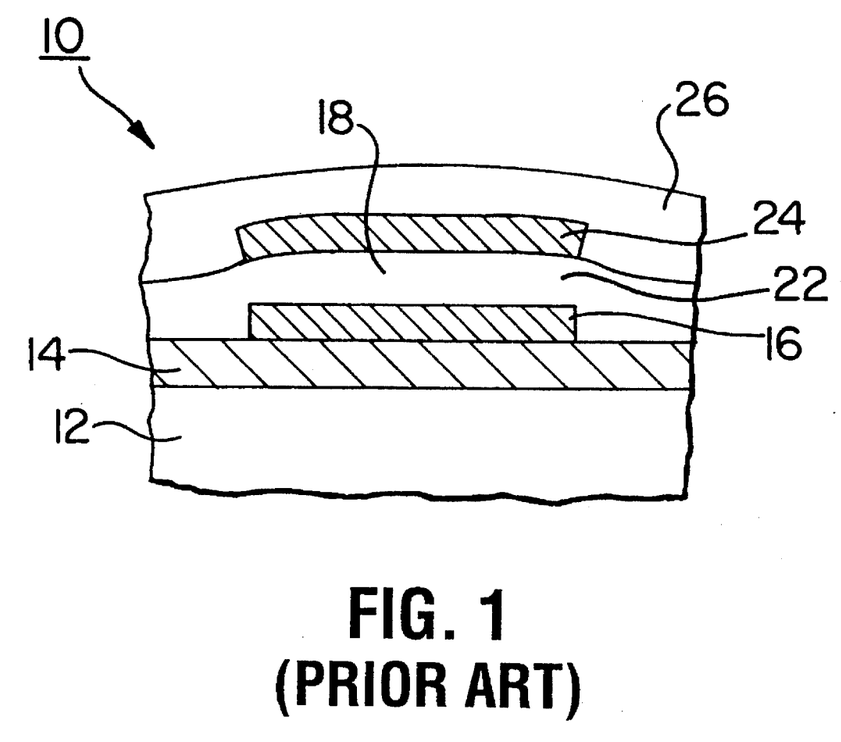
FIG. 1 shows a schematic cross-sectional view through part of a integrated circuit including a prior art capacitor structure.

Part of a prior art integrated circuit 10 comprising a stacked capacitor structure fabricated by a conventional method on a conventional semiconductor substrate 12 is shown in FIG. 1, comprising first and second electrodes 16 and 24, and capacitor dielectric 18. In fabricating this structure, a first dielectric layer 14 is provided on the substrate 12, and a first conductive layer, typically polysilicon, is deposited and patterned to define the bottom capacitor electrode 16. A layer of dielectric is deposited over the bottom electrode to provide the capacitor dielectric 18. The capacitor dielectric is planarized by a known process, e.g. using a spin-on-glass and etch back, to reduce surface topography around the edges of capacitor structure. However, this process tends to lead to edge thinning of region 22 of the dielectric 18 during etch back, as illustrated schematically in FIG. 1. A second conductive layer is deposited thereon and patterned to define a top capacitor electrode 24. A top dielectric layer 26 is deposited overall. For high voltage capacitors, edge thinning of the dielectric in region 22 may significantly degrade the breakdown voltage. Where a stacked capacitor structure with more than two electrodes is formed, the cumulative effect of edge thinning of several layers may significantly effect the planarity of the structure.

Figure 2:
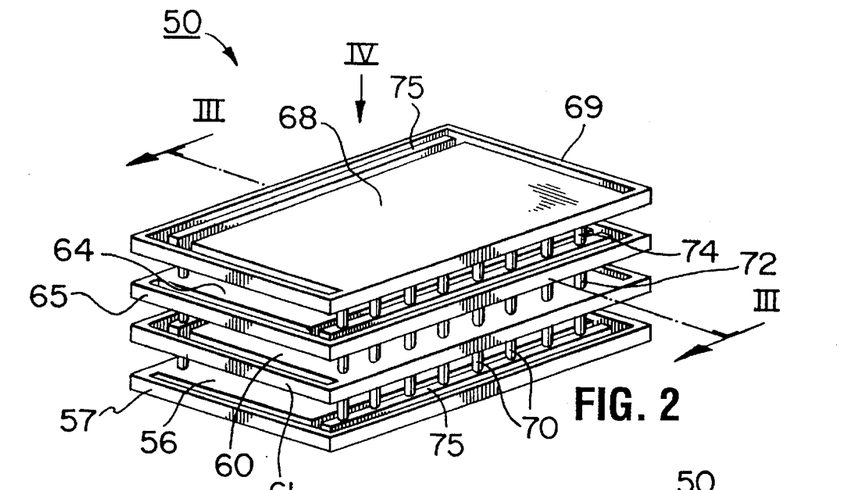
FIG. 2 shows a schematic oblique view of electrodes of a capacitor structure according to a first embodiment of the present invention.
Figure 3:
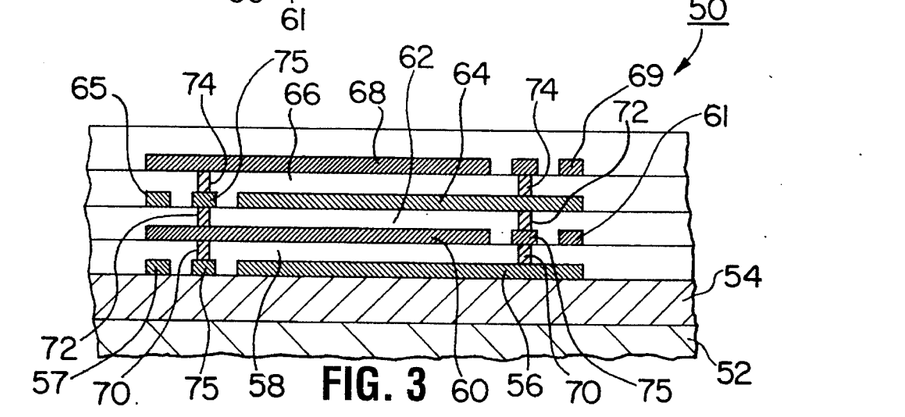
FIG. 3 shows a schematic cross-sectional view through the capacitor structure of FIG. 2 in a vertical plane through line III—III.
Figures 4A, 4B:
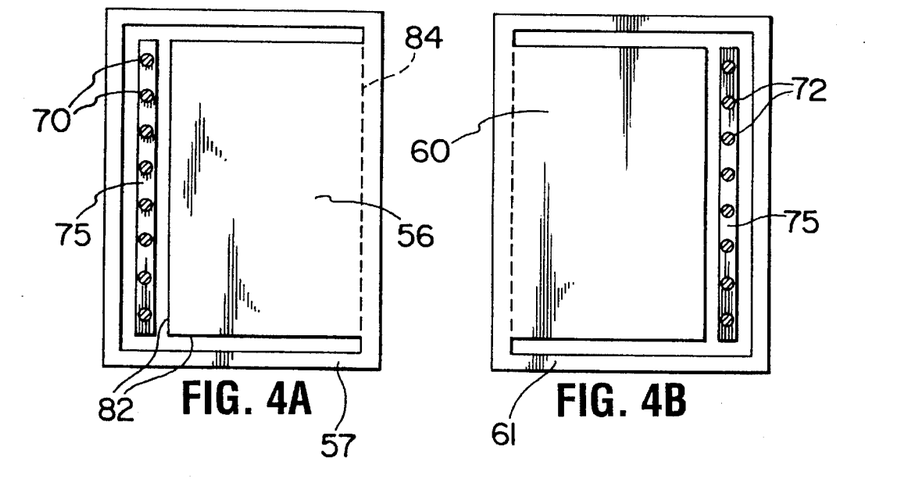
FIG. 4A and 4B shows a schematic top plan view of the first and second capacitor electrodes respectively, along arrow IV of FIG. 2.

Part of an integrated circuit having multilevel metallization and comprising a capacitor 50 fabricated according to a first embodiment of the present invention is shown in cross-section in FIG. 3. FIG. 2 shows an oblique view of the conductive electrodes of the capacitor structure 50, with the dielectric layers omitted for clarity. The capacitor 50 is formed on a dielectric isolation layer 54, e.g. a conventional field oxide or trench isolation layer on a semiconductor substrate 53. The capacitor structure comprises a bottom electrode 56, defined by part of a first conductive layer, comprising polysilicon. A first interlayer dielectric layer 58 is formed thereon, and a second electrode is defined by part of a conductive layer forming a first level of interconnect metallization 60 (metal 1). A layer 62 of interlayer dielectric is provided and then another layer of conductive material providing a second level of metallization (metal 2) is deposited and patterned to define a third electrode 64; another layer 66 of intermetal dielectric is deposited and a fourth electrode is formed from the top level metallization 67 (metal 3), to complete the structure. Each capacitor electrode has a main portion, i.e. 56, 60, 64 and 68, comprising a planar rectangular plate delineated by a boundary shown as edges 82 of the main portion 56 (see FIG. 4A) and a dashed line 74. A surrounding portion of each electrode i.e. 57, 61, 65, and 69 formed from the same layer of metallization as the main portion of each electrode. The surrounding portion takes the form of a coplanar ring, i.e. ring 57 which is spaced from the edges 82 of the main portion 56 of the bottom electrode along at least a part of the boundary defining edges 82. As shown in FIG. 4A, the surrounding portion extends from the main portion 56 along the boundary represented by the dashed line 84. Thus, each electrode resembles a conventional rectangular plate surrounded by a ring of a corresponding rectangular form. The ring is thus separated from the plate along 3 edges of the rectangular plate and is continuous with the other side which defines the boundary of the main portion of the electrode plate.

Sets of conductive vias 70, 72 and 74 are defined between adjacent electrodes, with separate parts 75 of each conductive layer interconnecting the vias, i.e. forming a jumper, which connects alternate electrodes to the same polarity. Thus, the capacitor structure is configured as a stacked capacitor equivalent to two capacitors in parallel. The capacitance is determined by the overlap of the main portions of the electrodes. The first conductive layer forming electrode 56 and ring 57 comprises, e.g. part of a polysilicon layer, which forms other elements of semiconductor device structures elsewhere on the integrated circuit. The second, third and fourth electrodes and their corresponding protective rings are formed from the first, second and third conductive layers comprising multilevel metallization forming conventional conductive interconnect on other parts of the integrated circuit. Plan views of individual electrodes 56 and 60, as viewed along arrow IV of FIG. 2 are shown in FIGS. 4A and 4B.

The protecting rings 57, 61, 64 and 69 ensure that during planarization, even if there is some thinning of the dielectric around edges of the structure, a uniform thickness of dielectric is maintained between the main portions of the capacitor electrodes, i.e. between the capacitor plates.

For example, in a method of fabricating a capacitor structure according to the first embodiment, as shown in FIGS. 2, 3, 4A and 4B, an integrated circuit substrate 52 is provided and a layer of conductive material is deposited on an isolation layer 54. The conductive layer is patterned to define bottom capacitor electrode comprising a rectangular main portion 56, and a surrounding portion 57 in the form of a rectangular ring (see FIG. 4A). The conductive layer forming the bottom electrode may comprise a layer of polysilicon, e.g. part of a gate polysilicon layer of a bipolar CMOS integrated circuit. The polysilicon layer may be doped in situ during deposition, or by ion implantation of an undoped polysilicon layer, as conventional and the polysilicon dopant is activated by a post deposition anneal to form a conductive layer of polysilicon. A planarized layer of dielectric 58 is provided on the bottom electrode, for example, by depositing a thick interlayer dielectric layer over the electrode, then a planarizing layer of spin on glass (SOG). This step is followed by an etchback, e.g. by reactive ion etching or other known method, leaving a planarized layer of dielectric of the required thickness extending over the electrode.

During planarization, the protecting rings prevent thinning of the dielectric near edges of the main portion of the electrode. Although some thinning may occur over edges of the protecting rings, the dielectric thickness between the main portions of the electrodes is maintained with a substantially uniform thickness. Any thinning at edges of the main portion of the capacitor plates is much less than near edges of the protecting rings. Thus the protecting rings substantially increase control of breakdown voltage, leakage current and improve manufacturing control of capacitance variation.

Vias 70 are defined through the dielectric 58 to the main portion of the electrode 56 and to connecting portion 75 of the conductive layer. The vias 70 are filled with conductive material to form contacts to the underlying electrode.

A second conductive layer is the provided by part of a first level of interconnect metallization which is deposited overall, and is patterned in a conventional manner to define a second capacitor electrode (FIG. 4B), overlying the first electrode, with a main portion 60 and a protecting ring 61, vertically aligned over the protecting ring 57, of the first electrode 60 (FIG. 2). The second electrode 60 of the capacitor structure is patterned to define a main portion 60 of the electrode which partly overlaps the main portion of the bottom electrode 56, i.e. as shown in FIGS. 1 and 3. Thus the area of overlap of the main portions 56 and 60 of the capacitor electrodes defines the active capacitor area.

Another layer of dielectric 62 is then provided, i.e. a layer of conventional interlayer dielectric. Another set of vias 72 are defined and filled with conductive material to provide interconnections between electrodes as shown in FIGS. 2, 4A and 4B. The stacking of the electrodes is shown schematically in FIG. 3. That is, a third electrode 64 of the capacitor being defined by part of a second level metallization layer, an intervening layer of interlayer dielectric 66 forming the capacitor dielectric thereon, then a top level of metallization defining the top (fourth) electrode 68 of the capacitor structure. Another set of conductive vias 74 provides interconnections with the underlying capacitor electrodes.

The resulting parallel plate configuration is such that main portions of conductive electrodes in all layers overlap, and are electrically interconnected so that any two adjacent layers are opposite polarities. This scheme results in electrically parallel connection of the capacitor plates so that the total capacitance is the sum of the capacitance of adjacent plates.

Preferably, the same spacing of the protecting rings from the electrodes is maintained for each electrode. The spacing depends on the planarization scheme and how much thinning of the edge of the electrodes is acceptable. In one example, using a 1 μm thick metal layer for each electrode, the protecting rings were placed ~3 μm from the edge of the electrode. Typically in structures with 1–2 μm thick metallization layers, closely spaced metal features were planarized very well with spin-on-glass schemes using a protecting ring which was placed within 3–5 μm of the electrode plate edge.

Regarding the choice of conductive material used for the electrodes, known conductive layers including polysilicon, conventional known metals and metal alloys, including aluminum, and metallic compounds such as TiN, TiW, etc., may be used. The sheet resistance should be sufficiently low to achieve linearity of the capacitor response over the operating voltage range.

When the bottom electrode is provided by a layer of polysilicon, it may be beneficial to silicide the entire electrode, to reduce the sheet resistance, e.g. if doping levels are not sufficiently high. Any suitable conventional known silicidation process may be used.

The interlayer dielectric (ILD) which in this structure forms the capacitor dielectric, is typically PSG or BPSG. The latter is generally deposited by chemical vapour deposition and then annealed by a conventional process. The ILD is planarized by ILD reflow, with or without further planarization. Alternatively planarization may be accomplished by a spin-on-glass (SOG) based process and/or chemical mechanical polishing (CMP). Alternatively, after deposition overall of a thick layer of intermetal dielectric, the latter planarized, by etching back i.e. by reactive ion etching or preferably by chemical mechanical polishing.

Figure 5:
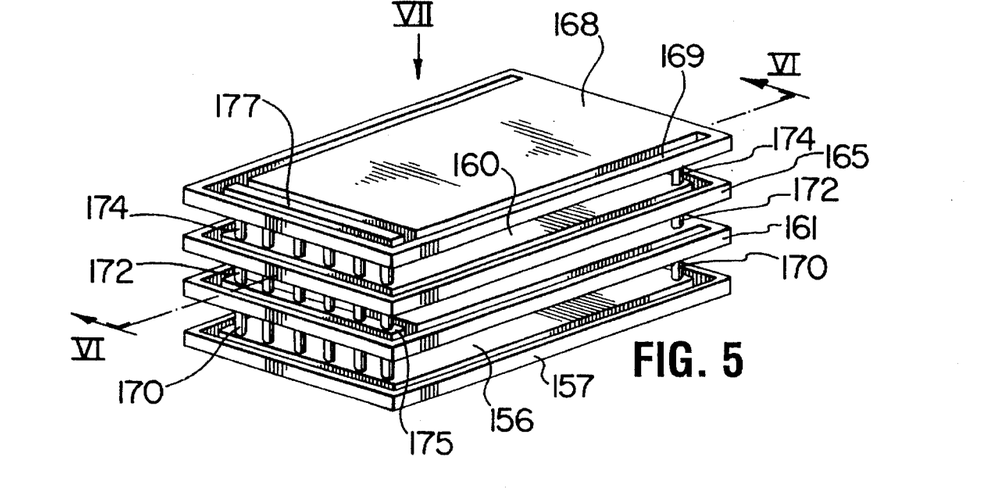
FIG. 5 shows a schematic oblique view of electrodes of a capacitor structure according to a second embodiment of the present invention.
Figure 6:
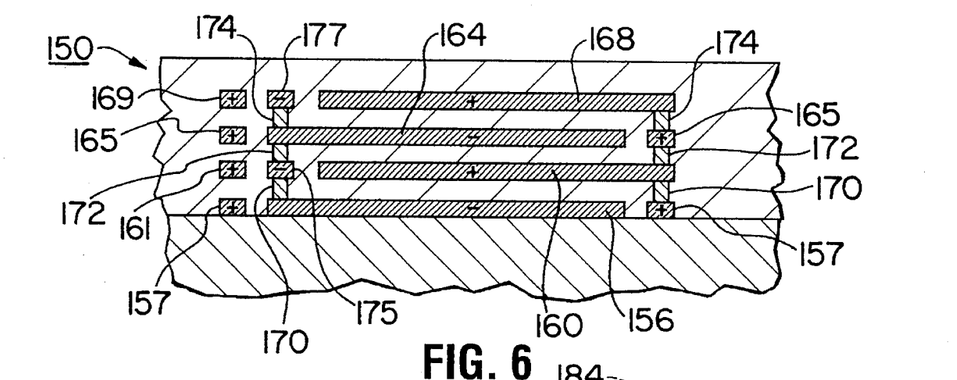
FIG. 6 shows a schematic cross-sectional view through the capacitor structure of FIG. 5, in a vertical plane through line VI—VI.
Figure 7A:
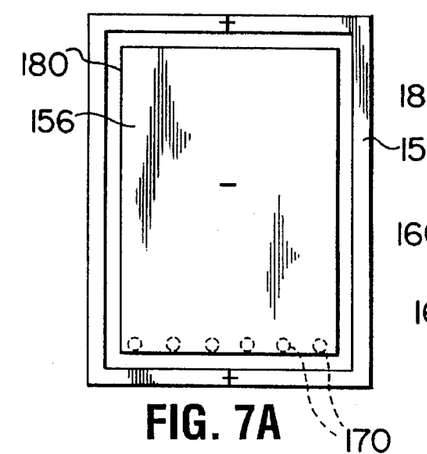
FIG. 7A and 7B shows a schematic top plan view of the first and second capacitor electrode structures respectively, along arrow VII of FIG. 5.
Figure 7B:
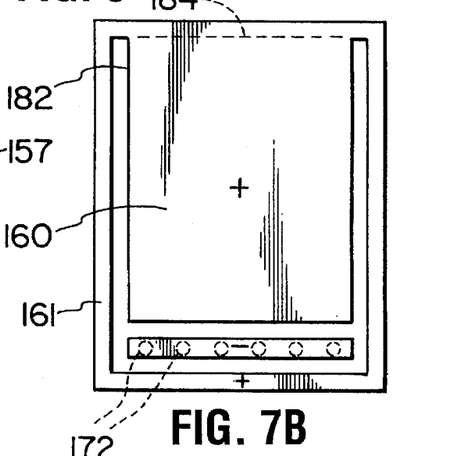

A capacitor structure according to a second embodiment of the present invention is shown in FIGS. 5 to 7. An oblique view of the conductive layers forming the capacitor electrodes is shown in FIG. 5 and a cross-sectional view through the capacitor electrodes is shown in FIG. 6. The first electrode comprises a main portion 156 and a surrounding portion 157, which takes the form of a ring spaced from the main portion along edges 180 of the main portion 156. Surrounding portion 157 thus forms a separate ring from the main portion 156 of the first electrode as shown in FIG. 7A. The structure of the second and fourth electrodes is similar to that of the electrodes of the capacitor first embodiment. That is, the second electrode, comprises a main portion 160 (see FIG. 7B) and a surrounding portion 161 which is spaced from the main portion 160 along three edges 182 of the main portion and continuous with the main portion along the remainder of the boundary 184. In plan view, the third electrode is of the same structure as the first electrode shown in FIG. 7A (i.e. having a separate ring) and the fourth electrode is of the same structure as the second electrode in 7B. Interconnections between electrodes are provided by sets conductive vias 170, 172 and 174 between successive conductive layers, as shown in FIG. 6. Sets of vias are interconnected through isolated parts 175 of the conductive layers which define the first and third electrodes, to provide connections between the first and third electrodes. Interconnections between the second and fourth electrodes are provided by vias forming interconnections through the rings 157 and 165.

Thus the electrodes are interconnected through the vias 170, 172,174. The polysilicon ring of the bottom electrode has no electrical connection to the polysilicon capacitor plate, and thus the plates at the two neighboring levels are not shorted. As shown, the stacking of the plates and rings associated with each level is such that all the rings are shorted electrically by via holes connecting each level. Thus alternate conductive electrodes are also shorted to the rings, as shown in FIG. 6.

Figure 8:
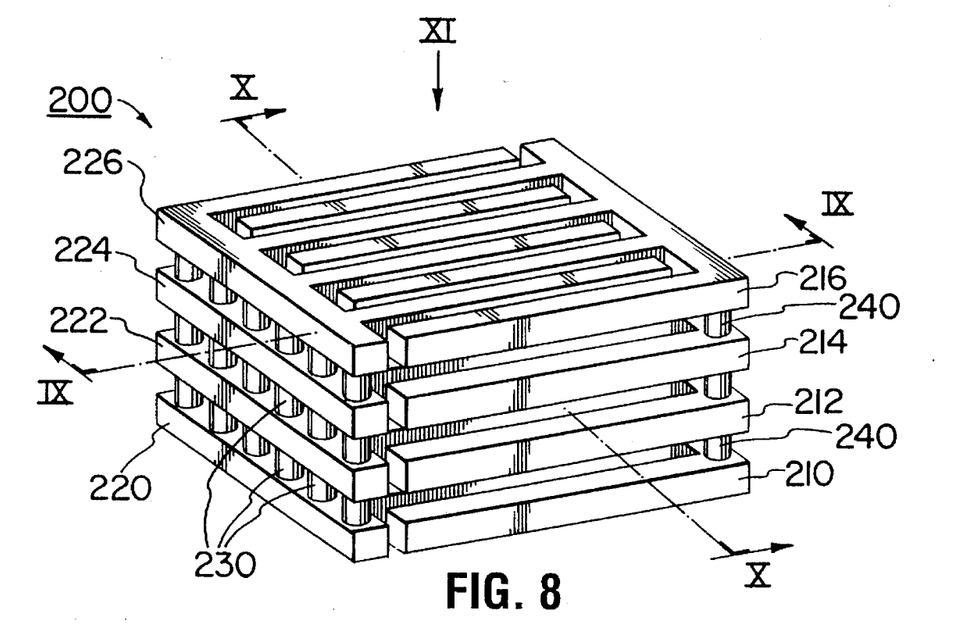
FIG. 8 shows a schematic oblique view of the electrodes of a capacitor structure according to a third embodiment, having electrodes comprising a plurality of interdigitated fingers.
Figure 9:
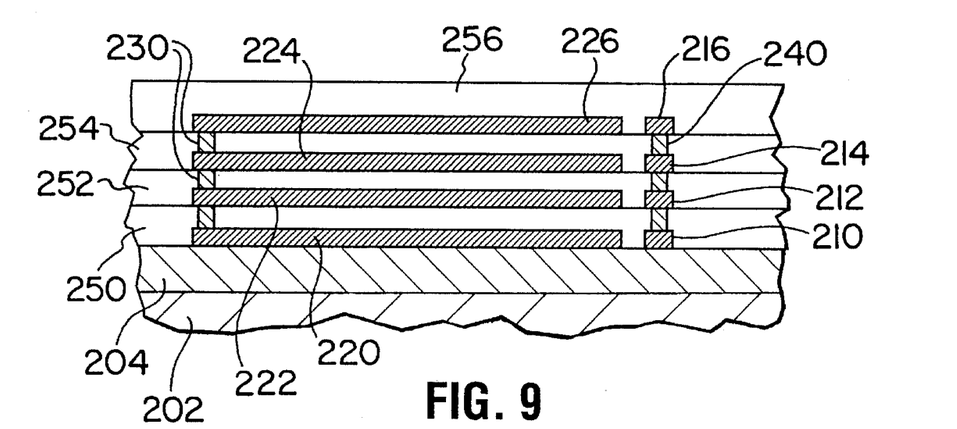
FIG. 9 shows a schematic cross sectional view of the capacitor of FIG. 8 in a plane through line IX—IX of showing the electrodes and intermetal dielectric layers of a capacitor structure of the third embodiment.

A capacitor structure 200 according to a third embodiment of the present invention is shown in FIGS. 8 to 11. As shown in FIG. 8, the capacitor structure 200 has a stacked structure similar to that of the first embodiment. However, each conductive layer is patterned to form a pair of electrodes. Each electrode comprises a main portion defining a plurality of elongate elements, i.e. fingers, each of which are interconnected at one end to form a comb like structure. The fingers, for example 211 and 221, in the two electrodes 210 and 220 are arranged in an interdigitated configuration as shown FIG. 11, which is a plan view of the top electrodes as viewed along arrow XI in FIG. 8. Four similar layers of electrodes are formed, respectively from a first conductive layer comprising a layer of polysilicon, and first, second and third levels of interconnect metallization respectively. The four conductive layers of the interconnect metallization each form pairs of electrodes 212 and 222, 214 and 224, and 216 and 226, identical in form to the bottom electrode pair 210 and 220, and isolated from one another by intervening layers of interlayer dielectric. Dielectric also extends between the individual fingers of each electrodes. Electrodes 210, 212, 214 and 216 form a set which are interconnected by a plurality of stacked conductive vias 240 and thus are all of the same polarity. Correspondingly, electrodes 220, 222, 224 and 226 are interconnected by vias 230 and form another set of electrodes of the opposite polarity. For clarity, the interlayer dielectric layers are not shown in FIG. 8. A cross-sectional diagram through the structure along one set of fingers is shown in FIG. 9, shows schematically how the conductive layers forming the electrodes are defined by successive layers of metallization and separated by the layers of interlayer dielectric 250, 252, 254, and top dielectric layer 256.

Figure 10:
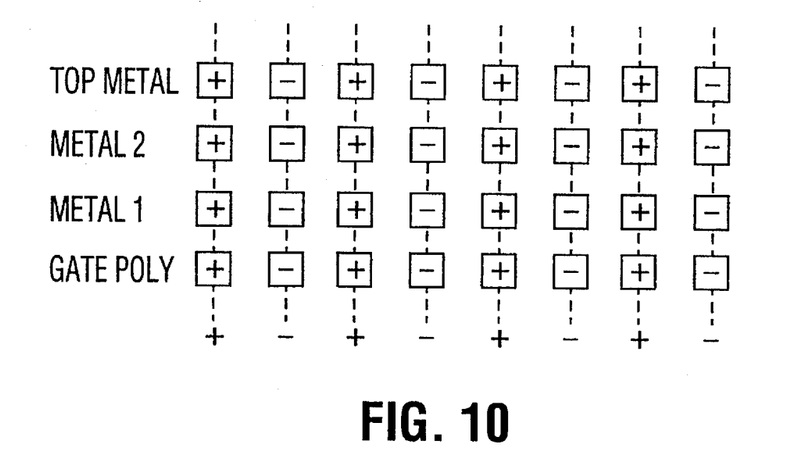
FIG. 10 shows a cross-sectional view in a plane through line X—X of FIG. 8, of the capacitor structure of the third embodiment with interconnections the electrodes being arranged to form vertical stacks of electrode fingers of the same polarity.
Figure 11:
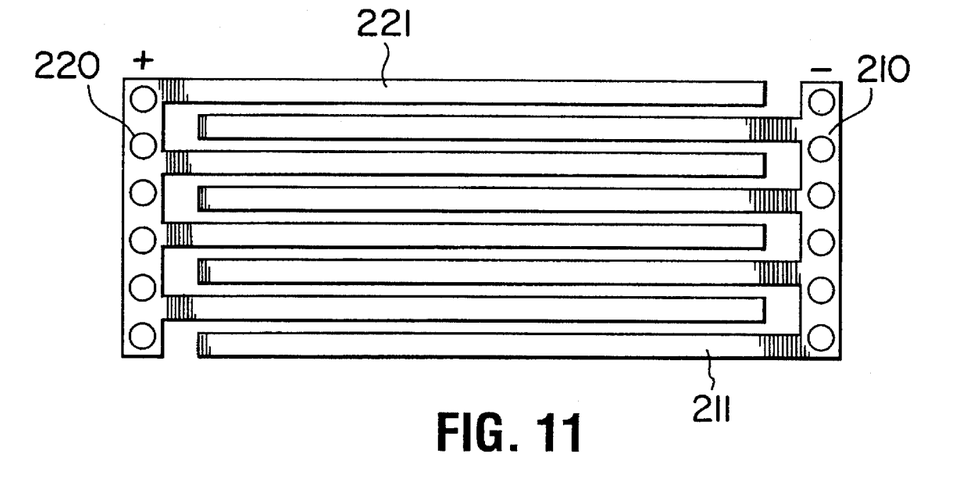
FIG. 11 shows a top plan view, along arrow XI of FIG. 8, of the top pair of interdigitated electrodes of the capacitor structure of the third embodiment.
Figure 12:
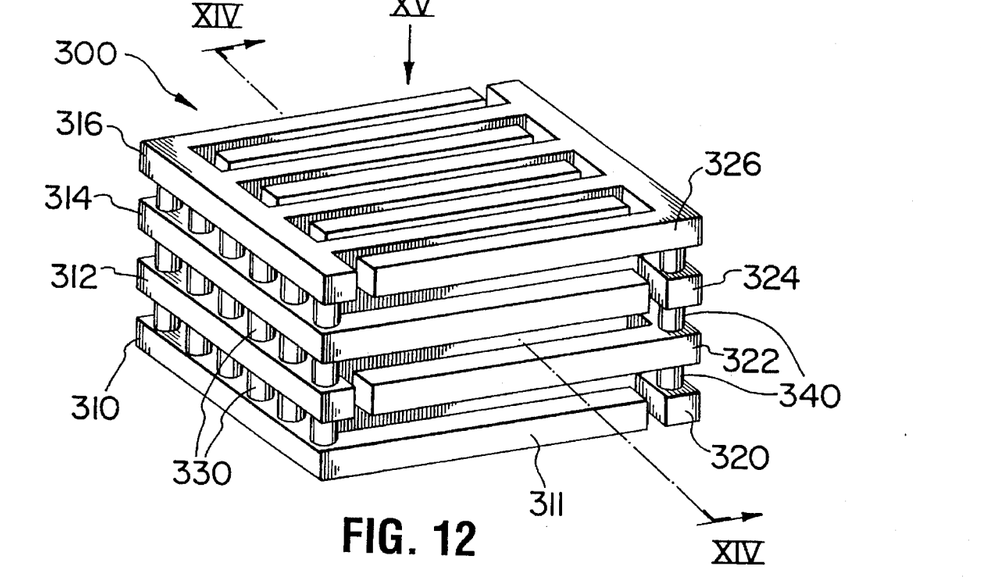
FIG. 12 shows a schematic oblique view of the electrodes of a capacitor structure according to a fourth embodiment of the invention having interdigitated electrodes interconnected so that alternate electrode fingers have opposite polarity.
Figure 13:
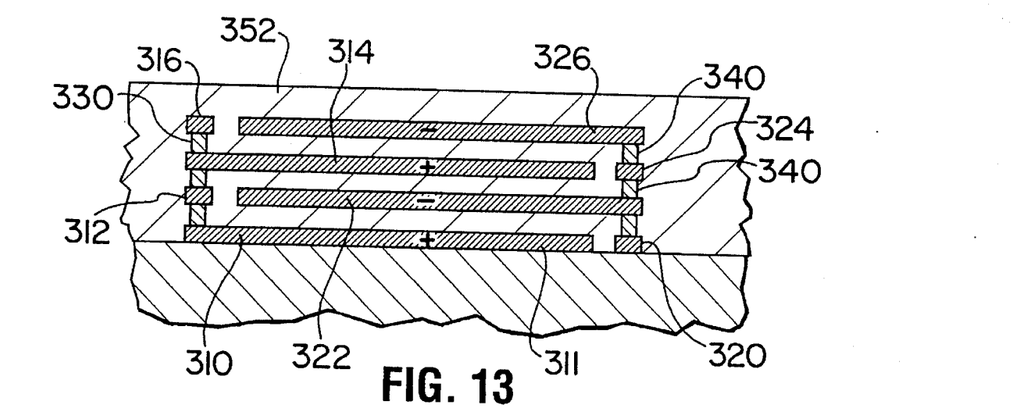
FIG. 13 shows a cross-sectional view of the electrode fingers in a vertical plane showing alternating polarities of adjacent electrode fingers in successive layers.

The two sets of electrodes of opposite polarity are arranged so that the resulting pattern of polarity of the fingers, shown in cross section through the capacitor structure in FIG. 10, is such that fingers in each layer are arranged adjacent fingers of the opposite polarity. Fingers of the same polarity are vertically stacked. This scheme results in an electrically parallel connection of capacitor plates. The total capacitance is the summation of the capacitance of all adjacent plates. Thus, the arrangement is effectively equivalent to a plurality of vertical capacitor plates each comprising a stack of fingers of the same polarity, with alternate plates are electrically connected to opposite polarities.

The effective area of each individual element, i.e. each finger of the electrode, is small. However this configuration effectively provides numerous parallel plates in the vertical direction and can be used to obtain similar capacitance as with horizontal stacked plates. As the metal spacing shrinks in future technologies, the effective dielectric thickness between such vertical electrical plates would be reduced, which would result in an increased capacitance between the plates.

The structure of the third embodiment is similar to the parallel plate configuration of the first embodiments except that effectively, each plate is divided into a plurality of straight parallel fingers. Any two adjacent fingers in the plane are connected to opposite polarities. The pattern of polarity of each layer can be different for each layer, or identical for each layer. When the same pattern of alternating polarity is applied to each level, as in the second embodiment, it results in an effective parallel plate configuration with vertical electrical plates, composed of vertically stacked lines in each of the four layers. Alternate vertical plates have opposite polarities.

As described below, other polarity configurations may be provided by alternative via interconnection schemes to provide other configurations of capacitor plates.

Consequently capacitor structures according to other embodiments of the present invention are provided by a set of electrodes of a similar structure, e.g. sets of planar, parallel interdigitated fingers, but using different configurations of interconnections to form different patterns of polarity of the individual fingers in a vertical plane.

Figure 14:
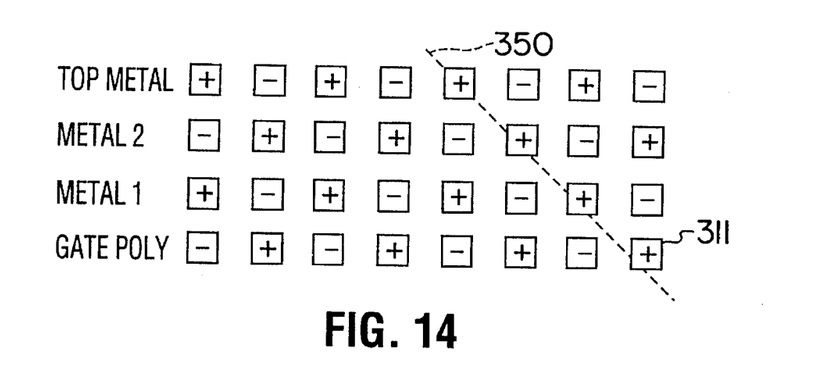
FIG. 14 shows a cross-sectional view in a plane through line XIV—XIV of FIG. 12, i.e. through one finger in each layer, to show the polarities of respective fingers of each electrode.

That is, a capacitor structure 300 according to a fourth embodiment of the present invention is shown in FIGS. 12 to 15. The capacitor is shown in oblique view in FIG. 12, for clarity showing only the conductive electrodes, and omitting the dielectric, as mentioned above, and in cross section in FIG. 13. FIG. 14 shows the structure in cross-section through the electrodes, along line XIV—XIV of FIG. 12.

Figure 15A:
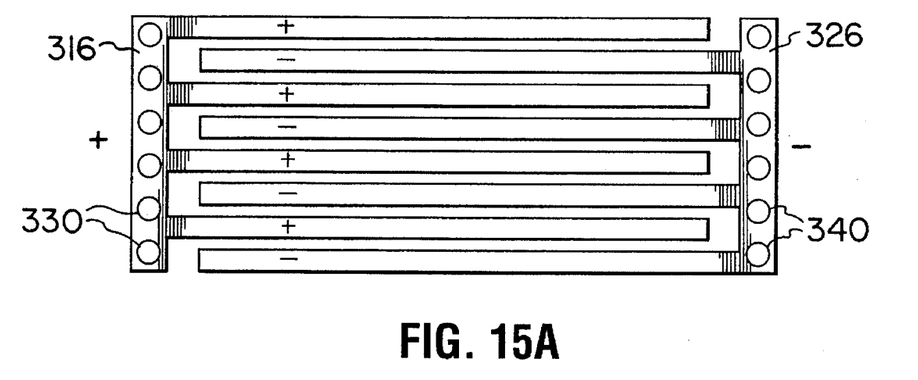
FIGS. 15A and 15B show plan views of the top electrode and underlying electrode of the structure of FIG. 12 along arrow XV, showing respective polarities and via interconnections of each electrode.
Figure 15B:
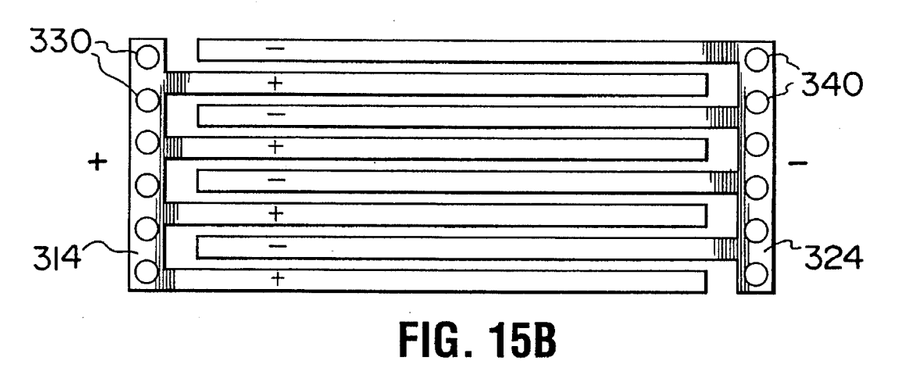

Plan views of individual electrodes are shown in FIGS. 15A and 15B.

The capacitor 300 of the fourth embodiment has interdigitated pairs of electrodes, 310 and 320, 312 and 322, 314 and 324, and 316 and 326, defined by each of four conductive layers, similar to the electrodes of the second embodiment. However, the structure of alternate layers differs in the configuration and interconnections between the electrodes fingers, so that alternate fingers of each electrode are interconnected to opposite polarities, and electrodes fingers in adjacent layers are also adjacent fingers of opposite polarities, as shown in FIG. 14, which is a cross-section cut vertically through the individual fingers, e.g. 311, of each electrode. In this configuration, stacks of electrode fingers of the same polarity stepped, and thus in effect inclined with respect to the substrate surface, e.g. along axis 350 of FIG. 14.

The overall configuration results in any two adjacent fingers horizontally or vertically being connected to opposite polarities as shown in FIG. 14. This configuration allows for an increase in the capacitance per unit surface area. The smaller the gap between the fingers, the higher the capacitance. Nevertheless, as the gap size is reduced, the dielectric breakdown voltage may be compromised.

Figure 16:
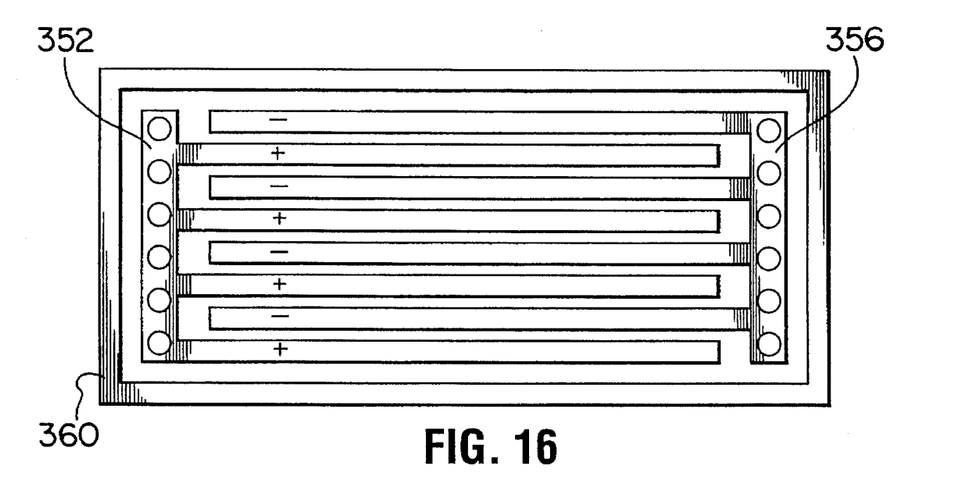
FIG. 16 shows a top plan view of a capacitor electrode according to a variation of the fourth embodiment, including a protecting ring surrounding the main part of the electrode.

In a capacitor structure which is a variation of the fourth embodiment, each layer of metallization provides a pair of capacitor electrode 352 and 356, similar to that of the fourth embodiment described above. In addition, each pair of electrodes is provided with a protecting ring 360, surrounding the main portion of each electrode, shown in FIG. 16. The ring similar to the protecting rings which are a feature of the capacitor first embodiment, and functions, reduce edge thinning of the dielectric during fabrication, thereby assisting in control of breakdown voltage.

Figure 17:
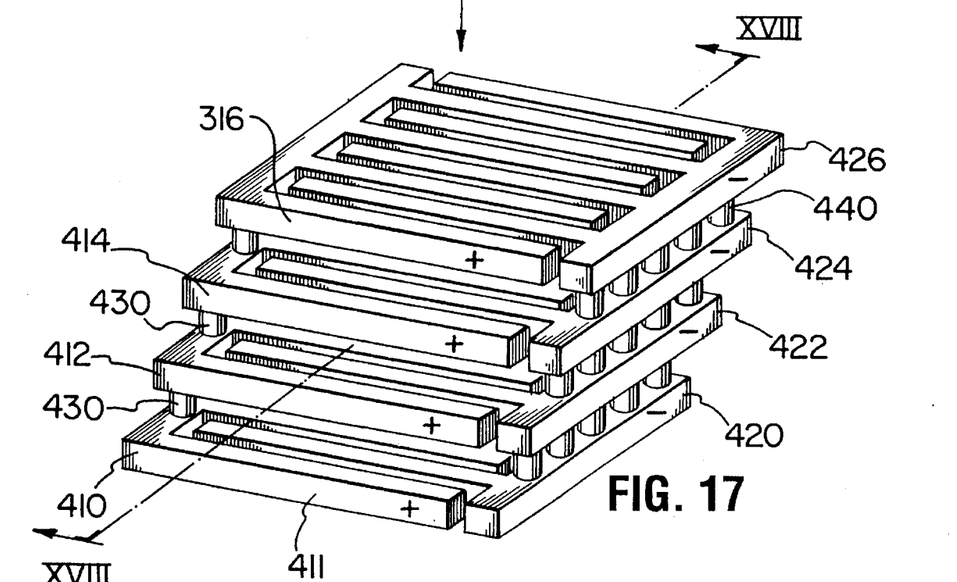
FIG. 17 shows a schematic oblique view of electrodes of a capacitor structure according to a fifth embodiment.
Figure 18:
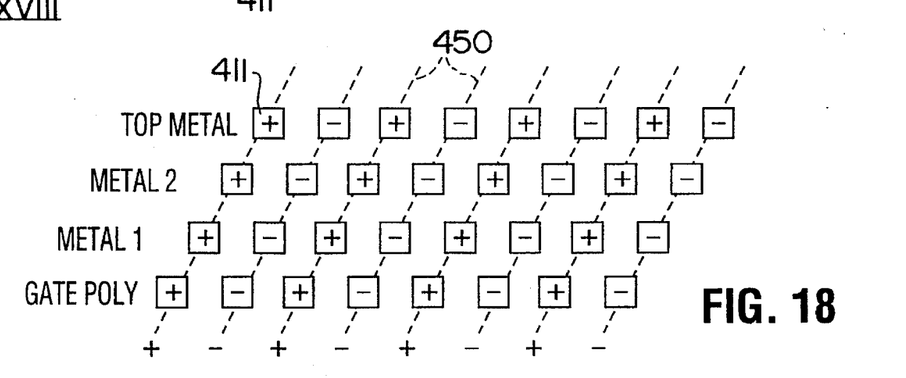
FIGS. 18 shows a cross-sectional view in a plane through line XVIII—XVIII of FIG. 17 of the electrodes of the capacitor structure of the fifth embodiment.
Figure 19:
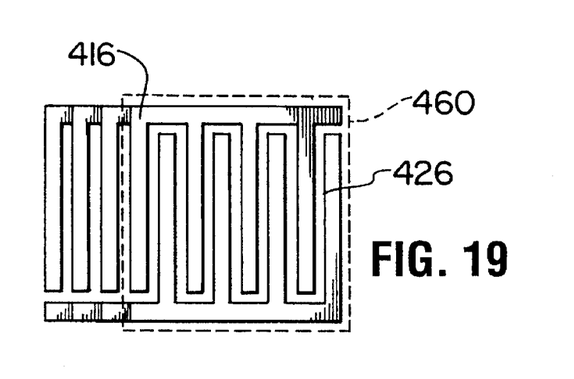
FIG. 19 shows a top plan view of the top electrode along arrow XIX of FIG. 17.

A capacitor structure 400 according to a fifth embodiment of the present invention is shown in FIG. 17, 18 and 19. The capacitor structure 400 comprises four layers of conductive metallization defining pairs of i electrodes 410 and 420, 412 and 422, 414 and 424, and 416 and 426, each having a plurality of fingers 411. The pairs of electrodes in each conductive layer are arranged with interdigitated fingers of electrodes, and interconnected so as to be configured similarly to those of the third embodiment, except that the conductive layers are stacked so that successive electrodes are laterally offset, as FIG. 19 shows schematically. Thus, individual fingers 411 in adjacent electrodes are in parallel alignment and laterally offset as shown in cross section in FIG. 18. This arrangement effectively provides vertically tilted stacks of electrode fingers as shown by the dashed lines 450 in FIG. 18. The stacks of electrode fingers are effectively equivalent to electrode plates inclined relative to the substrate surface, e.g. along axis 450, to provide an increased plate area/capacitance per unit surface area relative, to the structure of the second embodiment. FIG. 19 shows a top plan view along arrow XIX of FIG. 17 showing schematically how the electrodes are stacked. Optionally, a protecting ring, shown schematically by dashed line 460 may be provided around each pair of electrodes, similarly as described in other embodiments.

Figure 20A:
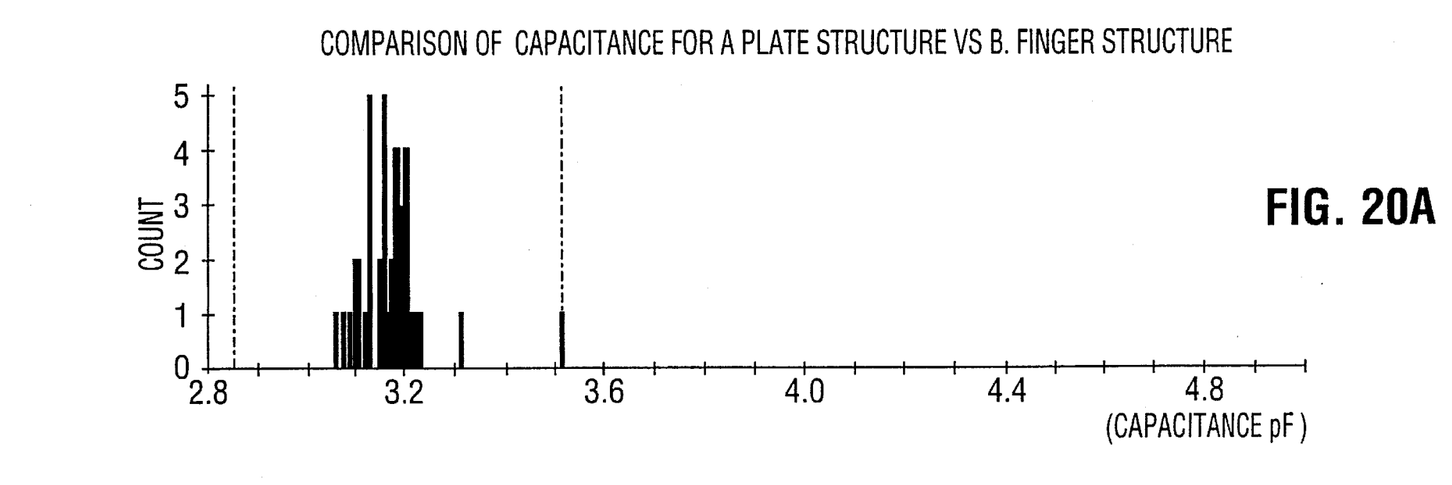
FIGS. 20A and 20B show test data characterizing capacitors fabricated according to the first and fourth embodiments respectively, and having the same design area.
Figure 20B:
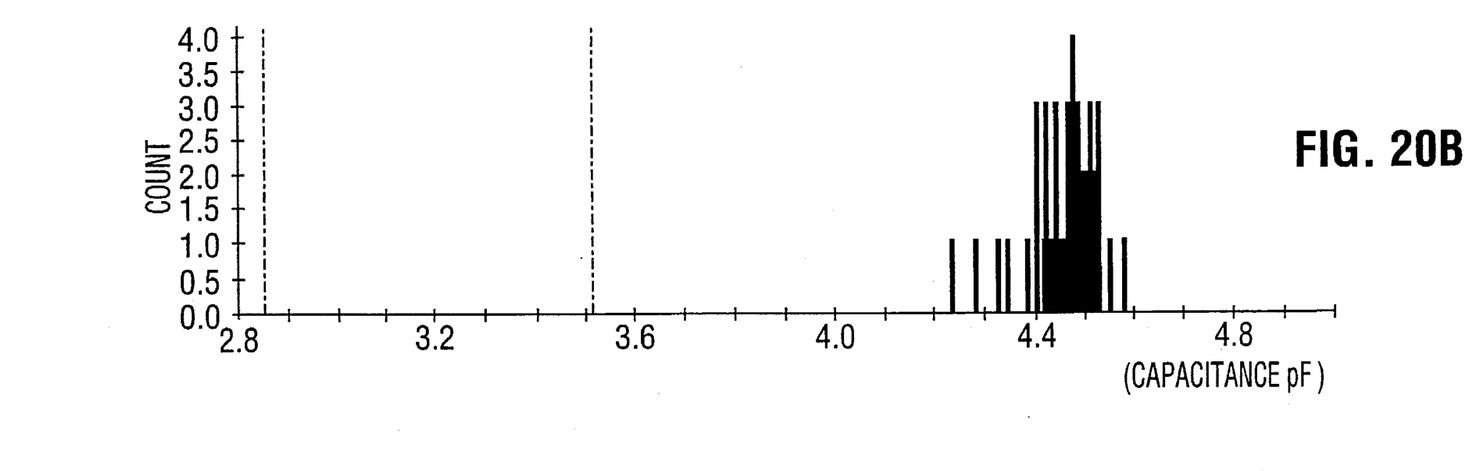

Depending on the interconnection between electrodes, and mode of application of signal, different electrical plate configurations may result FIG. 20A and 20B shows test results comparing measurements on two batches of capacitors, the first being of the rectangular parallel plate structure of the first embodiment, and the second being a capacitor according to the fourth embodiment. Both capacitors were defined with the same design area, and differ in that one has solid plate electrodes, and the other has electrodes having an interdigitated finger structure. These data show that the capacitance is significantly higher for the interdigitated electrode structure. The interdigitated finger structure of the electrodes of capacitor according to the fourth embodiment added as much as 40% capacitance for the same design area than a conventional parallel plate counterpart.

Figure 21:
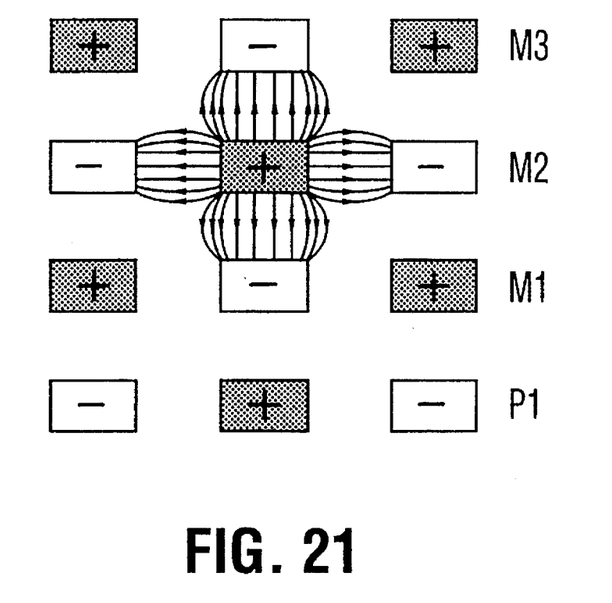
FIG. 21 shows a schematic cross sectional view through electrode fingers of a capacitor according to a fourth embodiment, illustrating the fringing electric field between electrode fingers.

The fringing field between electrode fingers for a structure similar to that of the fourth embodiment is shown schematically in FIG. 21. The interdigitated plates provide at least 40% more charge storage in the same volume. This increase in capacitance translates into about 30% reduction in the design area for the same capacitance requirement. Furthermore, these capacitors have breakdown voltages greater than 100 V. The leakage current of the interdigitated 3 pF capacitor was on average 25 pA at 13 V, a factor of 4 times higher than the structure of the first embodiment.

The following examples are provided to show why a parallel configuration of the high voltage back end capacitor has an inherent advantage in that the more the metal-dielectric-metal capacitors connected in parallel, the smaller the total capacitance variation.

In a simplified situation, if all dielectric layers have the same average thickness and variance, the percentage standard derivation of the capacitance is $1/\sqrt{N}$ that of the percentage standard derivation of the dielectric layer, where N is the number of metal-dielectric-metal capacitors connected in parallel and percentage of standard derivation is the percentage of the standard derivation divided by the mean.

Let C be the total capacitance of a back end capacitor with area A composed of three dielectric layers with thickness $d_1$, $d_2$ and $d_3$. Let $\epsilon$ be the relative permittivity and $\epsilon_0$ the permittivity of free space, then $$C = \epsilon\epsilon_0 A \left[ \frac{1}{d_1} + \frac{1}{d_2} + \frac{1}{d_3} \right]$$

Let $x_i = \frac{1}{d_i}$, then $$C = \epsilon\epsilon_0 A \sum_i x_i$$

The variance of the capacitance is $$\sigma_c^2 = (\epsilon\epsilon_0 A)^2 \sum_i \sigma_{xi}^2$$

Divide both sides by $C^2$, $$\frac{\sigma_c^2}{C^2} = \frac{\sum_i \sigma_{xi}^2}{\sum_i \sum_j x_i x_j}$$

Since $$x_i = \frac{1}{d_i}, \frac{\sigma_{xi}^2}{x_i^2} = \frac{\sigma_{di}^2}{d_i^2}$$

from the property of variance, $$\therefore \sigma_{xi}^2 = \left(\frac{x_i}{d_i}\right) \sigma_{di}^2 = \frac{\sigma_{di}^2}{d_i^4}$$

$$\frac{\sigma_c^2}{C^2} = \frac{\sum_i \frac{\sigma_{di}^2}{d_i^4}}{\sum_i \sum_j \frac{1}{d_i} \frac{1}{d_j}}$$

Example 1: In one process, BPSG has a thickness of 9537Å±593Å (6.23%), and the inter metal dielectric had a thickness of 12955Å±762.3Å (5.88%). Substituting these numbers into the previous equation, the variation in the total capacitance would be 3.53%.

In the special case that all dielectrics have the same average thickness and variance, $$d_i = d_j = d_k = d, \text{ then } \sigma_{di} = \sigma_{dj} = \sigma_{dk} = \sigma_o,$$

$$\frac{\sigma_c^2}{C^2} = \frac{3\sigma_0^2/d^4}{9(1/d^2)} = \frac{\sigma_0^2}{3d^2}$$

$$\therefore \frac{\sigma_c}{C} = \frac{\sigma_0}{\sqrt{3}\, d}$$

The percentage standard derivation of the total capacitance is $1/\sqrt{3}$ that of the percentage standard derivation of each dielectric layer.

Example 2: If the variation in the dielectric thickness is 13000Å±760Å (5.9%), then for a back end capacitor including 3 dielectric layers, the variation of the capacitance would have a percentage standard derivation $1/\sqrt{3}$ that of the dielectric, or 750/14000 divided by $\sqrt{3}$ =3.4%. In 3000 dies from 6 batches, a standard deviation of 2.7% was observed.

Figure 22:
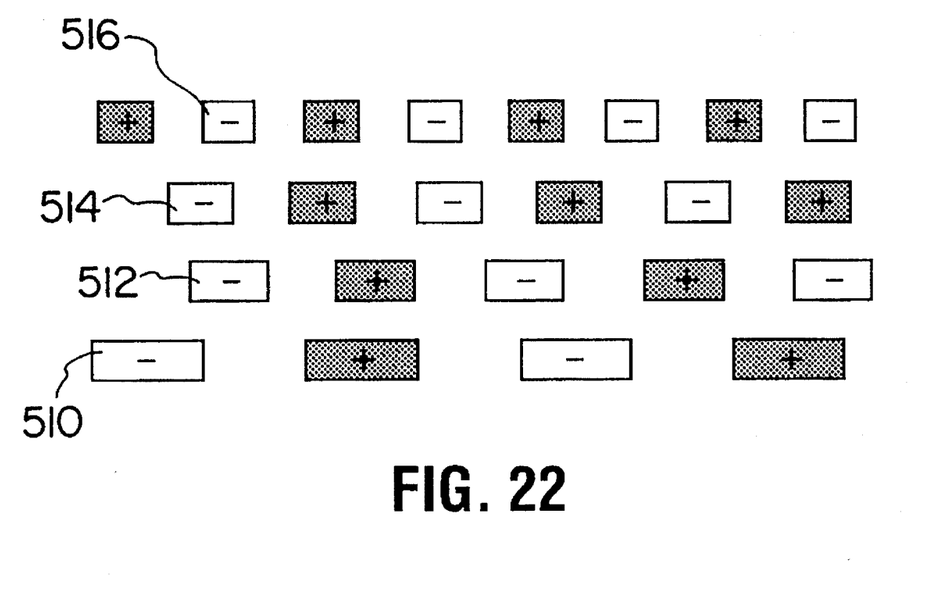
FIG. 22 shows a schematic cross-sectional view through the electrode fingers of a capacitor structure according to a sixth embodiment.

In a capacitor structure according to a sixth embodiment, the structure is similar to that of the fifth embodiment in comprising four layers of interdigitated electrode fingers (FIG. 22), with interconnections to provide stepped stacks of electrode fingers of the same polarity. The structures of the above described embodiments have uniformly sized fingers in each metal level, and uniform spacing between fingers in each level of metallization, On the other hand, the structure shown in FIG. 22 has spacing and line widths which are dependent on the level of metallization. As is typical in integrated circuits having multilevel metallization, the minimum design rules for metallization line width and metal-to-metal spacing are dependent on the respective level of metal, being largest for the top metal, and decreasing down to the first level of metallization. Consequently, the structure in FIG. 22 has electrode fingers, e.g. 510, 512, 514, 516 of dimensions and spacings which reflect these design rules. The non-uniform spacing of electrode fingers in each layer means that the electrode fingers are interconnected to formed stacks which are variously oriented relative to the surface.

In an alternative method of fabrication, using chemical mechanical polishing (CMP) for planarization, it was found that the protecting ring structure is not required. Since the ring adds to the area of the device structure, it is beneficial if the ring can be omitted to provide a significant reduction in area of the capacitor.

It will be apparent that many alternatives and variations on the structures of the embodiments are possible. In particular, electrodes of structures according to the embodiments may be fabricated with or without protecting rings, and protecting rings may be separate from or continuous with each electrode. In other embodiments, the protecting ring is provided in two parts, of the same or different polarities. Many different configurations of polarity for each electrode plate or finger are possible.

Further while the capacitor electrode structures described above comprise straight finger like electrodes, with each electrode fingers interconnected at one end, it will be clear that alternative capacitor electrode arrangements comprising a plurality of elongate elements or fingers may be defined and interconnected in other configurations.

Metallization schemes for advanced integrated circuits have been proposed using lower permittivity dielectrics (e.g. polyimides) as interlayer dielectrics, to reduce parasitic capacitance between conductors compared with conventional dielectrics, i.e. silicon dioxide, oxynitride and nitrides. In application of these materials to capacitor structures according to the present invention, the capacitor it would be necessary to increase the plate area to account for the reduced permittivity relative to conventional dielectrics. In the latter applications digitate capacitor plates are particularly beneficial in reducing area requirements, and with multilevel metallization, i.e. TLM, QLM, can be used to obtain higher capacitance per unit area as described above.

In multilevel metallization schemes, a subset of the metallization and intermetal dielectric layers may be used to construct capacitor structures according to the present invention. While the above described embodiments comprise four layers of capacitor plates, any pair of metal layers may be used to fabricated a capacitor structure having e.g. interdigitated electrodes, with or without the protective ring surrounding each layer. While it is convenient to use a layer of polysilicon for the bottom electrode, the four electrode capacitor structures described above may be fabricated from four levels of metallization.

Thus it will be appreciated that, while specific embodiments of the invention are described in detail above, numerous variations and modifications of these embodiments fall within the scope of the invention as defined in the following claims.

What is claimed is:

1. A capacitor structure for an integrated circuit having multilevel interconnect metallization comprising a plurality of layers of conductive metallization and layers of interlayer dielectric, the capacitor structure comprising:

an isolation layer having formed thereon a first electrode defined by part of a first layer of conductive metallization;

a layer of capacitor dielectric formed thereon provided by part of a first interlayer dielectric;

a second electrode defined by part of a second layer of conductive metallization and overlying the first electrode;

each electrode comprising a main portion and a surrounding portion, the main portion having a boundary, the boundary defining at least one edge of the main portion, and the surrounding portion extending around the boundary of the main portion and being spaced from the main portion along said at least one edge.

2. A capacitor structure for an integrated circuit having multilevel interconnect metallization comprising a plurality of layers of conductive metallization and layers of interlayer dielectric, the capacitor structure comprising:

an isolation layer having formed thereon a first electrode defined by part of a first layer of conductive metallization;

a layer of capacitor dielectric formed thereon provided by part of a first interlayer dielectric;

a second electrode defined by part of a second layer of conductive metallization and overlying the first electrode;

each electrode comprising a main portion having a boundary, the boundary defining at least one edge of the main portion, and a surrounding portion forming a ring surrounding the main portion and spaced from the at least one edge of the main portion.

3. A structure according to claim 2 wherein the surrounding portion is spaced from the main portion along the boundary to define a ring coplanar with and surrounding the main portion of the electrode.

4. A structure according to claim 2 wherein interconnections between electrodes provides for a main portion of one polarity, and a corresponding ring of the surrounding portion is of an opposite polarity.

5. A structure according to claim 2 wherein the ring comprises two parts.

6. A structure according to claim 2 wherein each electrode comprises a rectangular flat plate, the electrodes being stacked to provide a parallel stack of electrodes, each electrode having a coplanar surrounding portion of annular form spaced from the main portion.

7. A capacitor structure according to claim 2 wherein the capacitor comprises a stack of a plurality of electrodes, comprising:

conductive vias interconnecting alternate electrodes of the stack to provide sets of capacitor electrodes of the same polarity;

first and second electrical contacts being made respectively to sets of electrodes of opposite polarity, whereby the total capacitance of the stacked electrode structure is the sum of capacitances between alternate electrodes of opposite polarities.

8. A capacitor structure according to claim 7 wherein the stack of electrodes comprises:

a bottom electrode of the capacitor defined by an underlying conductive layer of the integrated circuit, and overlying electrodes are defined by at least two of the overlying layers of interconnect metallization.

9. A capacitor structure according to claim 8 wherein the underlying conductive layer comprises polysilicon.

10. A capacitor according to claim 2 wherein the main portion of each electrode comprises a plurality of interconnected fingers with dielectric extending therebetween.

11. A structure according to claim 10 wherein fingers in one layer of metallization are aligned vertically with fingers of adjacent layers of metallization.

12. A capacitor according to claim 10 wherein the plurality of fingers are in parallel alignment and are interconnected at an end of each finger, to form a comb like structure.

13. A structure according to claim 12 wherein fingers in each layer are in parallel alignment with, and stacked vertically relative to fingers in adjacent layers.

14. A structure according to claim 10 wherein fingers in alternating layers are laterally offset relative to fingers of an adjacent layer whereby stacks of fingers are inclined relative to a surface of the integrated circuit.

15. A structure according to claim 14 wherein fingers have dimensions comprising a width, and a spacing between each finger, said width and the spacing in each layer corresponding to the minimum design rule dimensions for the respective level of metallization, whereby the first level is more closely spaced than the top level of metallization.

16. A structure according to claim 10 wherein fingers have dimensions comprising a width, and a spacing between each finger, the width and the spacing being uniform for each layer.

17. A structure according to claim 10 wherein fingers in each layer are interconnected to form two sets of opposite polarity arranged in each layer, with each finger adjacent another finger of the opposite polarity, and in adjacent layers, fingers of the same polarity are offset relative to those in adjacent layers, thus providing stacks of fingers of the same polarity which are inclined with respect to a surface of the integrated circuit.

18. A capacitor structure for an integrated circuit having multilevel interconnect metallization comprising a plurality of layers of conductive metallization and layers of interlayer dielectric, the capacitor structure comprising:

an isolation layer having formed thereon a first electrode defined by part of a first layer of conductive metallization;

a layer of capacitor dielectric formed thereon provided by part of a first interlayer dielectric;

a second electrode defined by part of a second layer of conductive metallization and overlying the first electrode;

each electrode comprising a main portion having a boundary, the boundary defining at least one edge of the main portion, and a surrounding portion forming a ring surrounding the main portion, the ring being continuous with the main portion along part of the boundary, and spaced from the main portion along the at least one edge.

19. A capacitor structure for an integrated circuit having multilevel interconnect metallization comprising a plurality of layers of conductive metallization separated by layers of interlayer dielectric, the capacitor structure comprising:

a stack of electrodes, each electrode defined by part of one layer of conductive metallization and comprising a main portion having a boundary and a surrounding portion, the main portion defining a plurality of interconnected conductive fingers and the surrounding portion defining a ring surrounding and spaced from the main portion along at least part of the boundary;

the electrodes being separated by a capacitor dielectric defined by part of a respective layer of interlayer dielectric;

alternate electrodes being interconnected by conductive vias to provide sets of capacitor electrodes of the same polarity;

first and second electrical contacts being provided respectively to electrodes of opposite polarity, whereby the total capacitance of the stacked electrode structure is the sum of capacitances between alternate electrodes of opposite polarities.

* * * * *